United States Patent
Kim et al.

(10) Patent No.: US 12,119,288 B2
(45) Date of Patent: Oct. 15, 2024

(54) SEMICONDUCTOR PACKAGE

(71) Applicant: SAMSUNG ELECTRONICS CO., LTD., Suwon-si (KR)

(72) Inventors: Youngbae Kim, Seoul (KR); Sungwoo Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 167 days.

(21) Appl. No.: 17/658,614

(22) Filed: Apr. 8, 2022

(65) Prior Publication Data

US 2022/0415758 A1    Dec. 29, 2022

(30) Foreign Application Priority Data

Jun. 29, 2021    (KR) .......................... 10-2021-0084512

(51) Int. Cl.
*H01L 23/495* (2006.01)
*H01L 23/00* (2006.01)
*H01L 23/31* (2006.01)

(52) U.S. Cl.
CPC .... *H01L 23/4951* (2013.01); *H01L 23/49548* (2013.01); *H01L 24/16* (2013.01); *H01L 23/3107* (2013.01); *H01L 23/49513* (2013.01); *H01L 24/14* (2013.01); *H01L 2224/1415* (2013.01); *H01L 2224/16258* (2013.01)

(58) Field of Classification Search
CPC .......................... H01L 23/49541–49555; H01L 2924/181–186; H01L 2224/05616; H01L 2224/05116; H01L 2224/37116; H01L 2224/37616; H01L 23/495–49596; H01L 23/49861; H01L 21/4821–4842
See application file for complete search history.

(56) References Cited

U.S. PATENT DOCUMENTS

| | | | |
|---|---|---|---|
| 7,732,919 B2 | 6/2010 | Shimizu et al. | |
| 9,754,861 B2 | 9/2017 | Wong | |
| 9,799,613 B1 * | 10/2017 | Huang | H01L 23/49582 |
| 10,862,015 B2 | 12/2020 | Lee et al. | |
| 10,957,634 B2 | 3/2021 | Rodriguez et al. | |
| 2002/0084618 A1 | 7/2002 | Hasebe et al. | |
| 2014/0175627 A1 * | 6/2014 | Cruz | H01L 21/4828 257/676 |

(Continued)

FOREIGN PATENT DOCUMENTS

| | | |
|---|---|---|
| KR | 10-2002-0055369 | 7/2002 |
| KR | 10-2003-0019165 | 3/2003 |

(Continued)

*Primary Examiner* — Moin M Rahman
*Assistant Examiner* — Eric Manuel Mulero Flores
(74) *Attorney, Agent, or Firm* — F. CHAU & ASSOCIATES, LLC

(57) ABSTRACT

A semiconductor package includes: a lead frame that includes a first surface and a second surface opposite to the first surface, where the lead frame includes a first lead that extends in a first direction, and a plurality of second leads that are spaced apart from the first lead on both sides of the first lead; at least one semiconductor chip mounted on the first surface of the lead frame by a plurality of bumps; and an encapsulant that encapsulates the lead frame and the at least one semiconductor chip, wherein the first lead has a groove in the first surface that partitions the plurality of bumps in contact with the first lead.

9 Claims, 6 Drawing Sheets

(56) References Cited

U.S. PATENT DOCUMENTS

| | | | | |
|---|---|---|---|---|
| 2017/0244012 A1* | 8/2017 | Choi | ................ | H01L 33/62 |
| 2020/0194350 A1* | 6/2020 | Milo | ................ | H01L 23/49548 |
| 2021/0296216 A1* | 9/2021 | Fujiwara | ................ | H01L 23/49555 |

FOREIGN PATENT DOCUMENTS

| KR | 10-1672619 | 8/2016 |
|---|---|---|
| KR | 10-2018-0116733 | 10/2018 |
| KR | 10-2068078 | 1/2020 |

* cited by examiner

SEMICONDUCTOR PACKAGE

CROSS-REFERENCE TO RELATED APPLICATION(S)

This application claims priority under 35 U.S.C. § 119 from Korean Patent Application No. 10-2021-0084512, filed on Jun. 29, 2021 in the Korean Intellectual Property Office, the contents of which are herein incorporated by reference in their entirety.

BACKGROUND

Technical Field

Embodiments of the present inventive concept are directed to a semiconductor package.

Discussion of the Related Art

For the purpose of implementing weight reduction and increasing performance in electronic devices, miniaturization and high performance are needed in the semiconductor packages as well. To realize miniaturization, weight reduction, high performance, high capacitance, and high reliability of a semiconductor package, semiconductor packages in which a semiconductor chip is mounted on a lead frame are being studied.

SUMMARY

Embodiments of the present inventive concept provide a semiconductor package that has increased reliability.

According to an embodiment of the present inventive concept, a semiconductor package includes: a lead frame that includes a first surface and a second surface opposite to the first surface, where the lead frame further includes a first lead that extends in a first direction, and a plurality of second leads that are spaced apart from the first lead on both sides of the first lead, at least one semiconductor chip mounted on the first surface of the lead frame by a plurality of bumps, and an encapsulant that encapsulates the lead frame and the at least one semiconductor chip. The first lead has a groove in the first surface that partitions the plurality of bumps in contact with the first lead.

According to an embodiment of the present inventive concept, a semiconductor package includes: a lead frame that includes a first surface and a second surface opposite to the first surface, where the lead frame extends in a first direction, at least one semiconductor chip mounted on the first surface of the lead frame by a plurality of bumps disposed on first surface of the lead frame, and an encapsulant that encapsulates the lead frame and the at least one semiconductor chip. The lead frame includes a groove that partitions the plurality of bumps disposed on the first surface, and a volume of the groove is from 15% to 30% of a volume of the lead frame.

According to an embodiment of the present inventive concept, a semiconductor package includes: a semiconductor chip, and a lead frame that includes a first surface on which the semiconductor chip is mounted and a second surface opposite to the first surface, where the lead frame further includes a first lead that extends in a first direction across a center of a region that overlaps the semiconductor chip, and a second lead spaced apart from the first lead. The semiconductor chip is mounted on the first surface of the lead frame through a plurality of bumps, and the lead frame has a groove that partitions the plurality of bumps.

DETAILED DESCRIPTION

Hereinafter, exemplary embodiments of the present inventive concept will be described with reference to the accompanying drawings.

Figure 1:
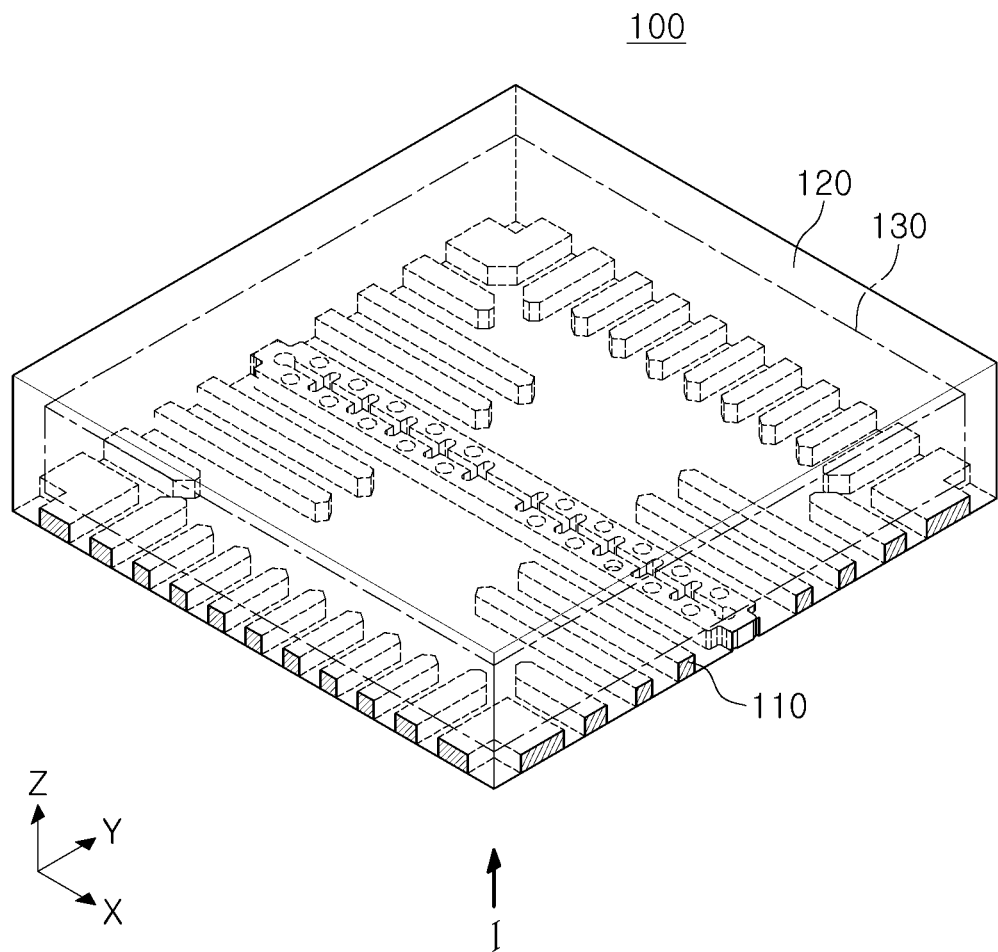
FIG. 1 is a perspective view of a semiconductor package according to an exemplary embodiment of the present inventive concept.
Figure 2:
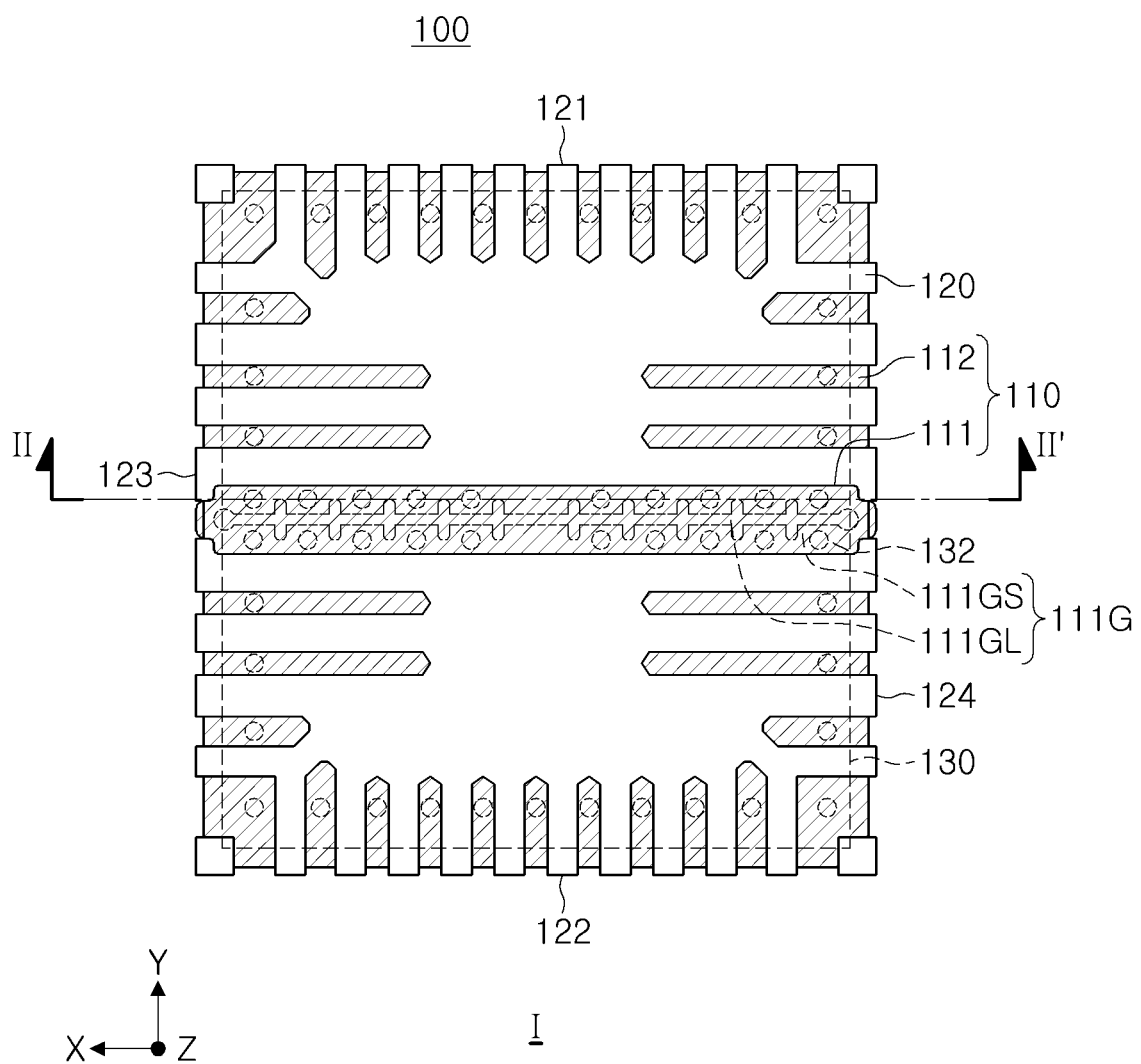
FIG. 2 illustrates a bottom surface of a semiconductor package as viewed in direction I of FIG. 1.
Figure 3:
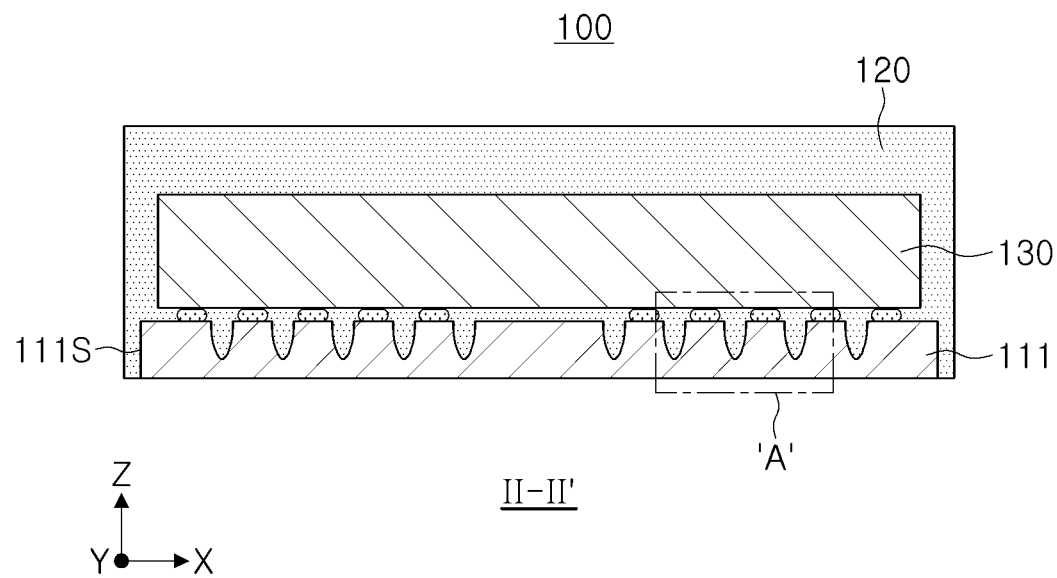
FIG. 3 is a cross-sectional view taken along line II-II' of FIG. 2.
Figure 4:
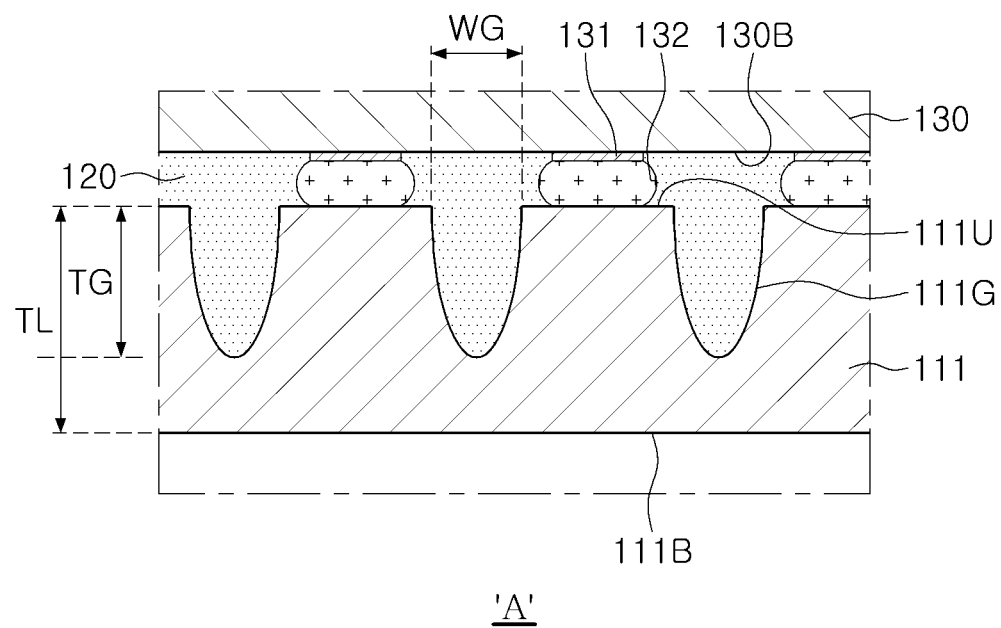
FIG. 4 is an enlarged view of portion 'A' of FIG. 3.

A semiconductor package 100 according to an exemplary embodiment will be described with reference to FIGS. 1 to 4. FIG. 1 is a perspective view of a semiconductor package according to an exemplary embodiment of the present inventive concept, while FIG. 2 illustrates a bottom surface of a semiconductor package as viewed in direction I of FIG. 1. FIG. 3 is a cross-sectional view taken along line II-II' of FIG. 2, and FIG. 4 is an enlarged view of portion 'A' of FIG. 3.

Referring to FIG. 1, a semiconductor package 100 according to an exemplary embodiment includes a lead frame 110, a semiconductor chip 130 mounted on the lead frame 110, an encapsulant 120 covering the lead frame 110 and the semiconductor chip 130. According to an exemplary embodiment, a case in which the semiconductor package 100 is a flip chip quad flat no-lead (FCQFN) package in which the semiconductor chip 130 is mounted on the lead frame 110 in a form of a flip-chip is illustrated in an example. However, embodiments of the present inventive concept are not limited thereto, and in other embodiments the case may be a quad flat no-lead (QFN) package or other types of packages in which a semiconductor chip is mounted on a lead frame.

Referring to FIG. 1, in an embodiment, the semiconductor package 100 may have a hexahedral shape, and a bottom surface of the semiconductor package 100 is a mounting surface of the semiconductor package 100.

The semiconductor chip 130 may be a memory semiconductor chip or a logic semiconductor chip. For example, the memory semiconductor chip may be a volatile memory chip such as a dynamic random access memory (DRAM) or a static random access memory (SRAM), or a non-volatile memory chip such as a phase-change random access memory (PRAM), a magnetoresistive random access memory (MRAM), a ferroelectric random access memory (FeRAM), or a resistive random access memory (RRAM), and the logic semiconductor chip may be a microprocessor, an analog device, or a digital signal processor. Referring to FIG. 4, an electrode pad 131 is disposed on a lower surface 130B of the semiconductor chip 130. The semiconductor chip 130 is mounted on the lead frame 110 by solder bumps 132 that connect the electrode pads 131 and the lead frame 110.

Referring to FIGS. 2 to 4, in an embodiment, the encapsulant 120 forms a bottom surface of the semiconductor package 100. The bottom surface of the encapsulant 120 has a rectangular shape that has first to fourth sides 121 to 124. In an exemplary embodiment, a case in which the bottom surface of the encapsulant 120 has a square shape has been described as an example, but embodiments of the present inventive concept are not limited thereto, and in other embodiments, the bottom surface of the encapsulant 120 has a rectangular shape. The lead frame 110 is exposed on the bottom surface of the encapsulant 120.

The lead frame 110 is formed of a metal or a metal alloy, and has a predetermined thickness. For example, the lead frame 110 is formed of copper or a copper alloy, and is formed by known cutting, stamping, or etching processes. According to exemplary embodiments, a surface of the lead frame 110 is plated with tin. The lead frame 110 provides a region to which a solder bump 132 of the semiconductor chip 130 is attached. The lead frame 110 has a first surface 111U and a second surface 111B located opposite to the first surface 111U, and may be partitioned into a plurality of regions. The second surface 111B of the lead frame 110 is exposed on the bottom surface of the semiconductor package 100. Each of the plurality of partitioned regions of the lead frame 110 is a plurality of leads to which solder bumps 132 are attached and electrically connected to the semiconductor chip 130. The plurality of leads are spaced apart from each other so as not to be electrically shorted by each other.

The lead frame 110 is disposed across a center of a region that overlaps the semiconductor chip 130. The plurality of leads in the lead frame 110 are classified as a first lead 111 and a second lead 112.

Referring to FIG. 2, in an embodiment, the first lead 111 crosses a central region of the bottom surface of the semiconductor package 100. That is, the first lead 111 connects opposite sides that face each other on the bottom surface of the semiconductor package 100. For example, the first lead 111 connects the third and fourth sides 123 and 124 on the bottom surface of the semiconductor package 100. However, embodiments are not limited thereto, and in other embodiments, the first lead 111 connects the first and second sides 121 and 122 on the bottom surface of the semiconductor package 100. The first lead is connects a center of one side and a center of the opposite side. However, the first lead 111 does not necessarily completely connect opposite sides on the bottom surface of the semiconductor package 100, and it is sufficient if the first lead 111 forms a straight line that connects the opposite sides. In addition, the first leads 111 are perpendicular to the opposite sides. However, embodiments of the present inventive concept are not limited thereto, and in other embodiments, the first lead 111 meets the opposite sides at an oblique angle. One or a plurality of first leads 111 may be disposed. When a plurality of first leads 111 are provided, the plurality of first leads 111 are parallel to each other. However, embodiments of the present inventive concept is not limited thereto, and according to exemplary embodiments, the plurality of first leads 111 may be disposed to not be parallel to each other. An exemplary embodiment in which one first lead 111 is disposed will be described as an example.

In an embodiment, the lead frame 110 includes a plurality of second leads 112. The plurality of second leads 112 are in contact with at least one of the first to fourth sides 121 to 124.

Referring to FIGS. 2 to 4, in an embodiment, a groove 111G is formed in the first lead 111. The groove 111G prevents cracks C from occurring in the solder bump 132 that connects the lead frame 110 and the semiconductor chip 130, due to differences in volume expansion coefficients of the lead frame 110 and the semiconductor chip 130. To this end, the groove 111G is formed that partitions the solder bumps 132 attached to a first surface 111U of the lead frame 110. One groove 111G is formed on the first surface 111U that separates a plurality of regions from each other. The groove 111G extends along substantially the length of the first lead 111.

The groove 111G is formed in the first surface 111U of the first lead 111 on which the semiconductor chip 130 is mounted. Accordingly, the groove 111G is not exposed on the bottom surface of the semiconductor package 100. The groove 111G is spaced apart from an outer side surface 111S of the first lead 111. However, embodiments of the present inventive concept are not limited thereto, and in other exemplary embodiments, the groove 111G may contact or communicate with the outer side surface 111S of the first lead 111.

The groove 111G is formed in a separate subsequent process after the lead frame 110 is formed, or may be formed together with the lead frame 110 in the same process. The groove 111G is formed by half etching in a direction of the first surface 111U of the first lead 111, and has a depth TG that does not completely penetrate the first lead 111. For example, the depth TG of the groove 111G may be about ⅓ to ½ of the thickness TL of the first lead 111. A width WG of the groove 111G is freely determined within a range in which the solder bumps 132 can be stably attached to the first surface 111U between the grooves 111G, depending on a size of the solder bumps 132 and a distance between the solder bumps 132. The width WG of the groove 111G is uniform along the length of the groove 111G when viewed from above the first surface 111U. However, embodiments of the present inventive concept are not limited thereto, and in some embodiments, the width of the grooves varies along the length of the groove, so that some regions of the grooves 111G are wider or narrower. For example, as will be described below, the width of some regions of the grooves 111G are greater than widths of other regions.

Referring to FIG. 2, in an embodiment, the groove 111G includes a first groove 111GL and a second groove 111GS, and the second groove 111GS branches from the first groove 111GL.

Specifically, the first groove 111GL is disposed along a center in a width direction of the first lead 111. The first groove 111GL extends in a longitudinal direction (X direction) in a center of the first lead 111, and the second grooves 111GS extend in a width direction (Y-direction) perpendicular to the extension direction of the first groove 111GL. At least one first groove 111GL is formed between the distribution of the solder bumps 132. The first groove 111GL partitions the solder bumps 132 attached to the first lead 111 in the longitudinal direction (X direction) of the first lead 111.

The second groove 111GS partitions the solder bumps 132 in a width direction (Y direction) of the first lead 111. Accordingly, the solder bumps 132 are respectively partitioned in a width direction (X direction) and a length direction (Y direction) of the first lead 111 by the first groove 111GL and the second groove 111GS. A plurality of second grooves 111GS are formed, and the number of the second grooves varies based on the distribution of the solder bumps 132. Each of the plurality of second grooves 111GS crosses the first groove 111GL. However, the second grooves 111GS are not necessarily perpendicular to the first groove 111GL, and in other embodiments, cross the first groove 1111GL diagonally, depending on the distribution of the solder bumps 132. An exemplary embodiment in which the first groove 111GL and the second groove 111GS are perpendicular to each other will be described as an example.

Figure 10:
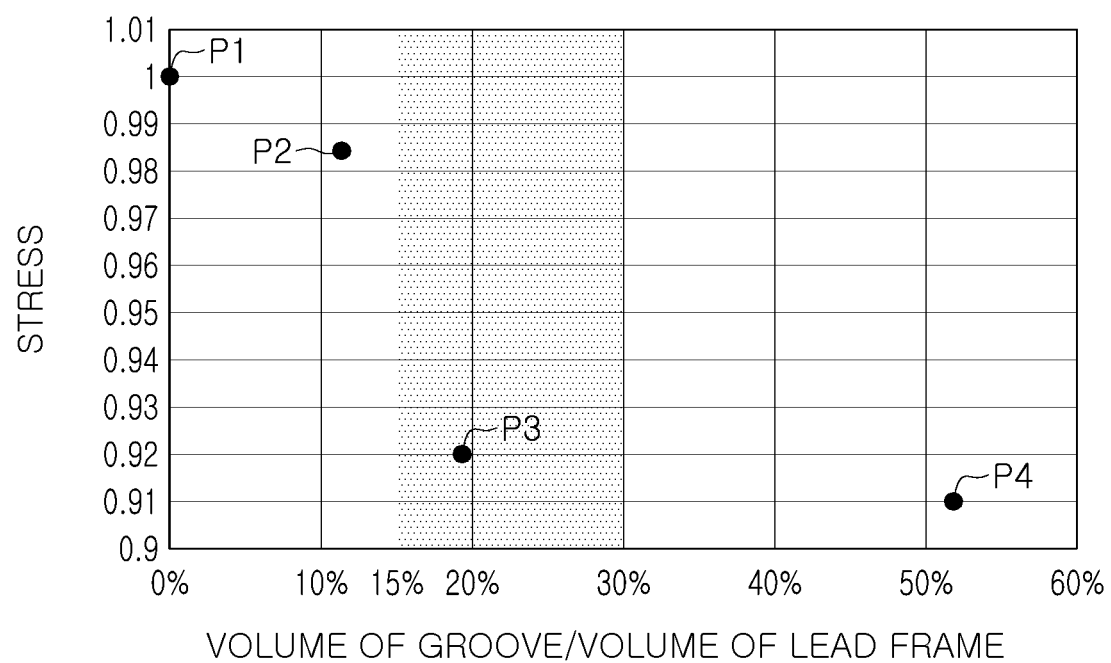
FIG. 10 is a graph of relative stress applied to solder bumps as a function of a ratio of a volume of a groove volume and a volume of a lead frame in Comparative Examples and Examples.

A volume of the groove 111G is about 15% to 30% of a volume of the lead frame 110. FIG. 10 is a graph of relative stress applied to solder bumps as a function of a ratio of a volume of a groove volume and a volume of a lead frame in Comparative Examples and Examples.

Referring to FIG. 10, in an embodiment, the stress applied to the solder bump is 1 in Comparative Example 1 (P1) in which no groove is formed, while the stress applied to the solder bump was reduced to 0.985 in Comparative Example 2 (P2), in which the volume of the groove 111G is less than 15% of the volume of the lead frame 110. On the other hand, in Example P3 in which the volume of the groove 111G is 15% to 30% of the volume of the lead frame 110, the stress of the solder bump was reduced to 0.92. In Comparative Example 3 (P4) in which the volume of the groove 111G exceeds 30% of the volume of the lead frame 110, even if the volume of the groove 111G was to increase, a reduction of the stress of the solder bump is not larger than that in the Example P3. That is, when the volume of the groove 111G exceeds 30%, a reduction of the stress of the solder bump is not large compared to the increase in the volume of the groove 111G. In addition, when the volume of the groove 111G exceeds 30%, the volume of the lead frame 110 is excessively reduced, thereby decreasing rigidity of the lead frame 110. Accordingly, the reliability of the semiconductor package 100 is reduced.

In addition, depending on an exemplary embodiment, the shape and disposition of a second groove 1111G can be modified. A modified example of the second groove will be described with reference to FIGS. 5 to 7.

Figure 5:
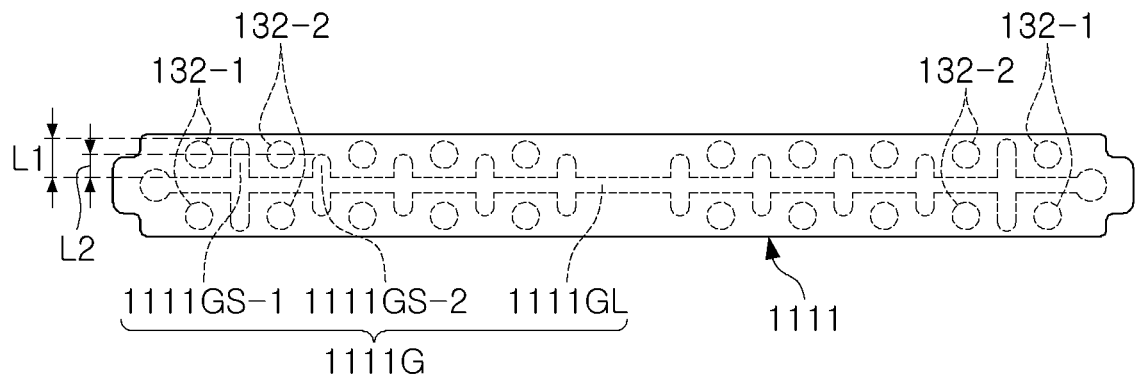
FIGS. 5 to 7 illustrate modified examples of the lead frame of FIG. 2.

FIG. 5 illustrates an embodiment in which a length of some second grooves is longer than a length of other second grooves. Referring to FIG. 5, in an embodiment, a groove 1111G includes a first groove 1111GL, a second groove 111GS and an adjacent second groove 1111GS-2, and the second groove 1111GS-1 and the adjacent second groove 1111GS-2 branch from the first groove 111GL. Referring to FIG. 5, in an embodiment, the length L1 of a second groove 1111GS-1 adjacent to both ends of a first lead 1111 is greater than the length L2 of an adjacent second groove 111GS-2.

Stress applied to first solder bumps 132-1 at both ends of the first lead 1111 is greater than a stress applied to the second solder bumps 132-2, and in this case, when a length L1 of the second groove 1111GS-1 adjacent to both ends of the first lead 1111 is greater than a length L2 of the adjacent second groove 111GS-2, a difference in stress applied to the first solder bump 132-1 and the first solder bump 132-2 is offset.

Figure 6:
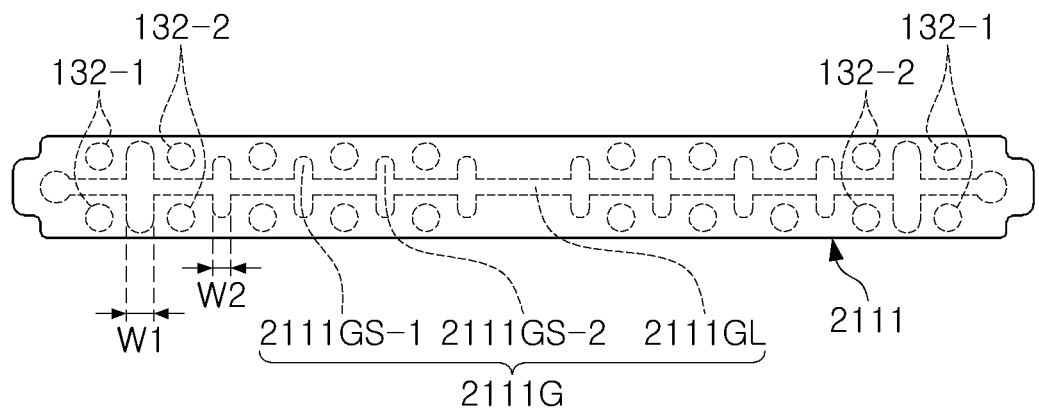

FIG. 6 shows an embodiment in which a width of some second grooves is greater than that of other second grooves. Referring to FIG. 6, in an embodiment, a groove 2111G includes a first groove 2111GL, a second groove 211GS and an adjacent second groove 2111GS-2, and the second groove 2111GS-1 and the adjacent second groove 2111GS-2 branch from the first groove 2111GL. Referring to FIG. 6, in an embodiment, a width W1 of the second groove 2111GS-1 adjacent to both ends of a first lead 2111 is greater than a width W2 of the adjacent second groove 2111GS-2. As described in a modified embodiment of FIG. 5, the stress applied to the first solder bumps 132-1 disposed at both ends of the first lead 2111 is greater than the stress applied to the second solder bumps 132-3 not disposed at both ends of the first lead frame 2111, and in this case, when a width W1 of the second groove 2111GS-1, is greater than a width W2 of the adjacent second groove 2111GS-2, a difference in stress applied to the first solder bumps 132-1 and the second solder bumps 132-2 can be offset. In further embodiments, both the width W1 and the length L1 of the second groove 2111GS-1 adjacent to both ends of a first lead 2111 are greater than a width W2 and the length L2 of the adjacent second groove 2111GS-2.

Figure 7:
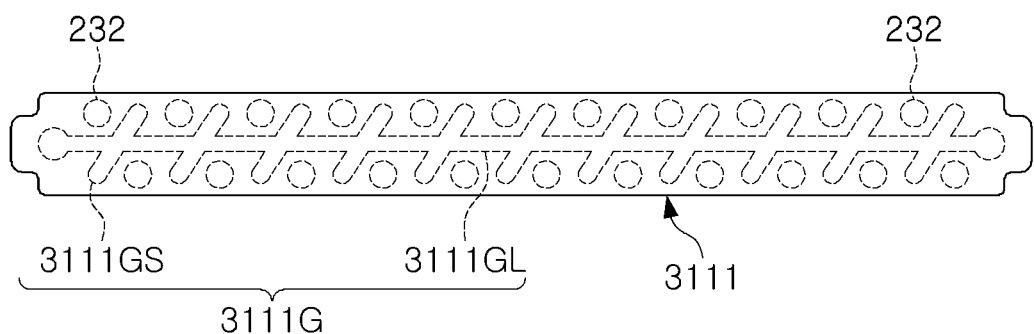

FIG. 7 illustrates an embodiment in which a second groove crosses a first groove diagonally. Referring to FIG. 7, in an embodiment, when solder bumps 232 are disposed on a first lead 3111 in a zigzag pattern, a second groove 3111GS intersecting a first groove 3111GL is diagonally disposed to partition the solder bumps 232. That is, the second grooves 3111GS are not perpendicular to the first groove 3111GL.

An encapsulant 120 is formed that covers a lead frame 110 and a semiconductor chip 130 to a predetermined thickness. The encapsulant 120 covers a portion of the first surface 111U and a side surface 111S of the lead frame 110. In addition, the encapsulant 120 covers a side surface and an upper surface of the semiconductor chip 130. However, depending on the exemplary embodiment, the encapsulant 120 might not cover the upper surface of the semiconductor chip 130. In this case, the upper surface of the semiconductor chip 130 is exposed from the encapsulant 120. The encapsulant 120 may include, for example, an epoxy molding compound (EMC), but a material of the encapsulant 120 is not particularly limited.

In the semiconductor package 100 of an above-described exemplary embodiment, as compared to a semiconductor package in which no groove is formed in a lead frame, cracks can be prevented from occurring in a solder bump due to differences in a coefficient of volumetric expansion between the lead frame and the semiconductor chip.

Figure 8:
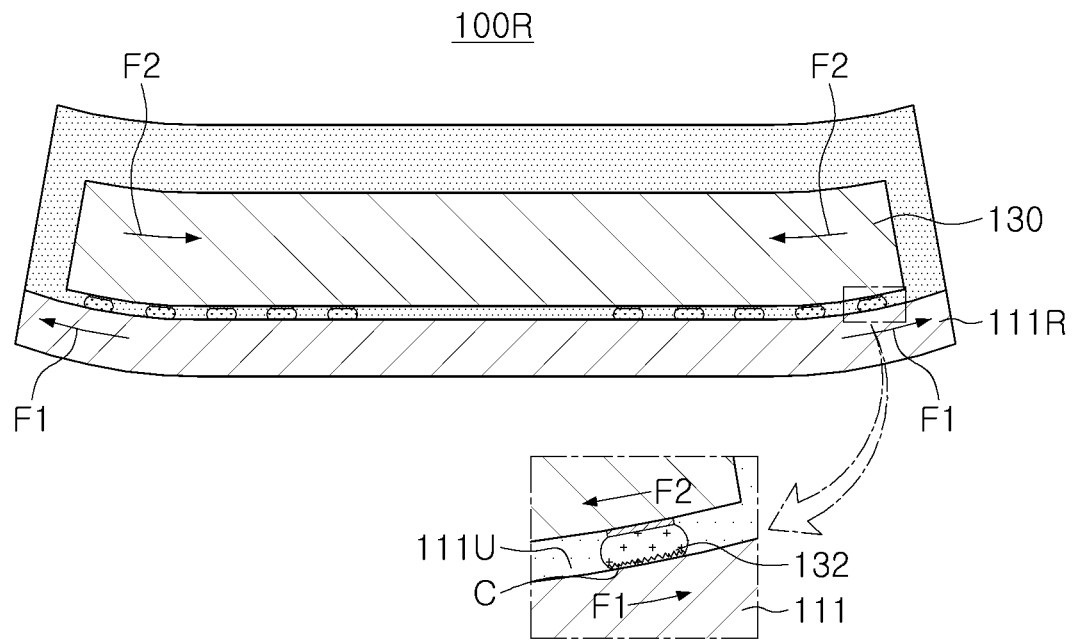
FIGS. 8 and 9 illustrate stresses respectively applied to bumps of a semiconductor package according to a Comparative example and an Example.

The formation of cracks will be described with reference to FIGS. 8 and 9. FIG. 8 illustrates a case in which a high temperature is applied to a semiconductor package of a Comparative example in which no groove is formed in a lead frame, and FIG. 9 illustrates a case in which a high temperature is applied to a semiconductor package according to an exemplary embodiment.

In general, during a manufacturing process, a semiconductor package is f heated to a high temperature. Referring to FIG. 8, since a lead frame 110R made of metal has a relatively greater coefficient of volumetric expansion than the semiconductor chip 130, when heated to a high temperature, a volume of the lead frame 110 increases more than a volume of the semiconductor chip 130. Due to the volume differences, a first force F1 for expansion is generated in the lead frame 110R, and a second force F2 that offsets the first force F1 is generated in the semiconductor chip 130. Accordingly, a shear force is applied to solder bumps 132 that connect the lead frame 110R and the semiconductor chip 130, and cracks C can occur in the solder bumps 132. Since a volume increase amount of the lead frame 110R heated to a high temperature gradually increases toward an outermost portion of the lead frame 110R, a larger shear force is applied to the solder bumps 132 disposed at the outermost portion of the lead frame 110R than to older bumps 132 disposed at an inner portion of the lead frame 110R, such that cracks C occur more frequently in the solder bumps 132.

Figure 9:
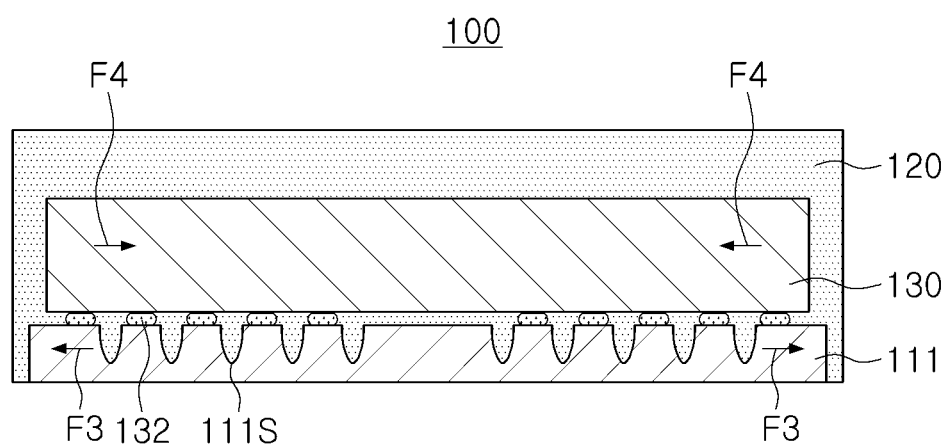

Referring to FIG. 9, in an embodiment, in the semiconductor package 100 according to an exemplary embodiment, a groove 111G is formed in the lead frame 110 so that the volume of the lead frame 110 is reduced. Accordingly, a smaller third force F3 occurs as compared to the first force F1 generated in the lead frame 110R of the Comparative example of FIG. 8. Since a magnitude of the third force F3 generated in the lead frame 110 is reduced, a magnitude of a fourth force F4 that offsets the third force F3 is also reduced, and a shear force applied to the solder bump 132 is reduced. Accordingly, in an exemplary embodiment, the occurrence of cracks C in the solder bumps 132 can be prevented as compared to the Comparative example of FIG. 8 described above.

As set forth above, according to embodiments of the present inventive concept, by forming a groove in a lead frame on which a semiconductor chip is mounted, a semiconductor package having increased reliability is provided.

While the exemplary embodiments have been shown and described above, it will be apparent to those skilled in the art that modifications and variations could be made without departing from the scope of embodiments of the present inventive concept as defined by the appended claims.

What is claimed is:

1. A semiconductor package, comprising:
   a lead frame that includes a first surface and a second surface opposite to the first surface, wherein the lead frame further includes a first lead that extends in a first direction, and a plurality of second leads that are spaced apart from the first lead on both sides of the first lead;
   at least one semiconductor chip mounted on the first surface of the lead frame by a plurality of bumps; and
   an encapsulant that encapsulates the lead frame and the at least one semiconductor chip,
   wherein the first lead has a groove in the first surface that partitions the plurality of bumps in contact with the first lead, wherein the groove comprises,
   a first groove disposed in the first lead and that extends in the first direction; and
   a plurality of second grooves that extend from the first groove in a second direction that is perpendicular to the first direction,
   wherein the first groove and each of the second grooves is spaced apart from an outer side surface of the first lead,
   wherein first groove partitions the plurality of bumps in the first direction, and the second grooves partition the plurality of bumps in the second direction.

2. The semiconductor package of claim 1, wherein a volume of the groove is from 15% to 30% of a volume of the first lead.

3. The semiconductor package of claim 1, wherein the groove has a depth of from ⅓ to ½ of a thickness of the first lead.

4. The semiconductor package of claim 1, wherein the first groove is disposed along a center in a width direction of the first lead.

5. The semiconductor package of claim 1, wherein
   the plurality of second grooves comprise a first group disposed adjacent to both ends of the first lead, and a second group other than the first group, and
   a length of the first group is greater than a length of the second group.

6. The semiconductor package of claim 1, wherein
   the plurality of second grooves comprises a first group disposed adjacent to both ends of the first lead, and a second group other than the first group, and
   a width of the first group is greater than a width of the second group.

7. The semiconductor package of claim 1, wherein
   the encapsulant includes first and second sides that face each other and third and fourth sides that connect the first and second sides, wherein the encapsulant forms a bottom surface of the semiconductor package,
   wherein the second surface of the lead frame is exposed by the bottom surface.

8. The semiconductor package of claim 7,
   wherein the first lead connects the first and second sides,
   wherein the plurality of second leads are in contact with at least one of the first to fourth sides.

9. The semiconductor package of claim 8, wherein the first lead connects a center of the first side and a center of the second side.

* * * * *